United States Patent
Lee et al.

(10) Patent No.: US 6,787,917 B2
(45) Date of Patent: Sep. 7, 2004

(54) APPARATUS FOR PACKAGE REDUCTION IN STACKED CHIP AND BOARD ASSEMBLIES

(75) Inventors: Teck Kheng Lee, Singapore (SG); Kian Chai Lee, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/387,036

(22) Filed: Mar. 12, 2003

(65) Prior Publication Data

US 2003/0164550 A1 Sep. 4, 2003

Related U.S. Application Data

(63) Continuation of application No. 09/874,671, filed on Jun. 5, 2001, now Pat. No. 6,583,502.

(30) Foreign Application Priority Data

Apr. 17, 2001 (SG) .......................................... 200102360

(51) Int. Cl.[7] .............................................. H01L 23/48
(52) U.S. Cl. ........................ 257/777; 257/685; 257/723
(58) Field of Search ................................ 257/723, 685, 257/686, 777

(56) References Cited

U.S. PATENT DOCUMENTS

| | | | |
|---|---|---|---|
| 5,012,323 A | 4/1991 | Farnworth | |
| 5,128,831 A | 7/1992 | Fox, III et al. | |
| 5,291,061 A | 3/1994 | Ball | |
| 5,323,060 A | 6/1994 | Fogal et al. | |
| 5,399,898 A | 3/1995 | Rostoker | |
| 5,422,435 A | 6/1995 | Takiar et al. | |
| 5,434,745 A | 7/1995 | Shokrgozar et al. | |
| 5,495,398 A | 2/1996 | Takiar et al. | |
| 5,513,076 A | 4/1996 | Werther | |
| 5,689,135 A | 11/1997 | Ball | |
| 5,719,440 A | 2/1998 | Moden | |
| 5,811,879 A | 9/1998 | Akram | |
| 5,891,753 A | 4/1999 | Akram | |
| 5,973,403 A | 10/1999 | Wark | |
| 5,998,860 A | * 12/1999 | Chan et al. | ................. 257/679 |
| 6,051,878 A | 4/2000 | Akram et al. | |
| 6,093,969 A | * 7/2000 | Lin | ............................ 257/777 |
| 6,218,731 B1 | * 4/2001 | Huang et al. | ............... 257/738 |
| 6,300,163 B1 | * 10/2001 | Akram | ....................... 438/108 |
| 6,506,625 B1 | * 1/2003 | Moden | ....................... 438/107 |
| 6,512,303 B2 | * 1/2003 | Moden | ....................... 257/778 |
| 6,563,217 B2 | 5/2003 | Corisis et al. | |
| 6,583,502 B2 | * 6/2003 | Lee et al. | .................... 257/686 |
| 2003/0006496 A1 | * 1/2003 | Vaiyapuri | .................... 257/686 |
| 2003/0069654 A1 | 4/2003 | Larson | |

FOREIGN PATENT DOCUMENTS

JP 1-280326 * 11/1989 ................. 257/753

* cited by examiner

Primary Examiner—Jasmine Clark
(74) Attorney, Agent, or Firm—TraskBritt

(57) ABSTRACT

An electronic device package having semiconductor die-carrying interposer substrates in a stacked configuration. Each interposer substrate bears at least one die mounted by its active surface to a surface of the interposer substrate and wire bonded to terminals on the opposing substrate surface through an opening in the interposer substrate. Two interposer substrates are placed together with die-carrying sides outward and electrically connected with conductive elements extending transversely therebetween to form an interposer assembly, the interposer assembly bearing conductive elements extending transversely from one of the interposer substrates for connection to a carrier substrate. The space between the interposer substrates may be filled with a dielectric underfill material, as may the space between the interposer assembly and the carrier substrate to which the former is mounted.

20 Claims, 5 Drawing Sheets

APPARATUS FOR PACKAGE REDUCTION IN STACKED CHIP AND BOARD ASSEMBLIES

CROSS-REFERENCE TO RELATED APPLICATION

This application is a continuation of application Ser. No. 09/874,671, filed Jun. 5, 2001, now U.S. Pat. No. 6,583,502, issued Jun. 24, 2003.

BACKGROUND OF THE INVENTION

1. Field of the Invention

The present invention relates to a method and apparatus for increasing integrated circuit density. In particular, the present invention relates to a method and apparatus for semiconductor package volume and height reduction with enhanced reliability and simplification of the fabrication process for stacked semiconductor dice.

2. State of the Art

Chip-On-Board ("COB") or Board-On-Chip ("BOC") technology is used to attach a semiconductor die to a carrier substrate such as a printed circuit board ("PCB") and may be effected using flip-chip attachment, wire bonding, and tape automated bonding ("TAB").

Flip-chip attachment generally consists of electrically and mechanically attaching a semiconductor die by its active surface to a carrier substrate using a pattern of discrete conductive elements therebetween. The conductive elements are generally disposed on the active surface of the die during fabrication, but may instead be disposed on the carrier substrate. The discrete conductive elements may comprise minute conductive bumps, balls or columns of various configurations. Each conductive element is placed corresponding to superimposed, mutually aligned locations of bond pads (or other I/O locations) on the semiconductor die and terminals on the carrier substrate. The semiconductor die is thus electrically and mechanically connected to the carrier substrate by, for example, reflowing conductive bumps of solder or curing conductive or conductor-filled epoxy bumps. A dielectric underfill may then be disposed between the die and the carrier substrate for environmental protection and to enhance the mechanical attachment of the die to the carrier substrate.

Wire bonding and TAB attachment techniques generally begin with attaching a semiconductor die by its back side to the surface of a carrier substrate with an appropriate adhesive, such as an epoxy or silver solder. A plurality of fine wires is discretely attached to bond pads on the semiconductor die and then extended and bonded to corresponding terminal pads on a carrier substrate. The bond wires are generally attached through one of three conventional wire bonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts. A dielectric encapsulant such as a silicone or epoxy may then be applied to protect the fine wires and bond sites. In TAB, ends of metal leads carried on an insulating tape such as a polyimide are attached to the bond pads on the semiconductor die and corresponding terminal pads on the carrier substrate.

Higher performance, lower cost, increased miniaturization of components, and greater packaging density of integrated circuits are ongoing goals of the computer industry. As new generations of integrated circuit products are released, the number of components used to fabricate them tends to decrease due to advances in technology even though the functionality of the products increases. For example, on the average, there is approximately a 10 percent decrease in components for every product generation over the previous generation having equivalent functionality.

In integrated circuit packaging, in addition to component reduction, surface mount technology has demonstrated an increase in semiconductor chip density on a single substrate or board, resulting from more compact designs and form factors and a significant increase in integrated circuit density. However, greater integrated circuit density is becoming significantly limited by the space or "real estate" available for the mounting of semiconductor dice on a carrier substrate.

One method of increasing integrated circuit density is to stack dice vertically. U.S. Pat. No. 5,012,323 ("the '323 patent"), issued Apr. 30, 1991 to Farnworth, teaches combining a pair of dice mounted on opposing sides of a lead frame. An upper, smaller die is back-bonded to the upper surfaces of the leads of the lead frame via a first adhesively coated, insulated film layer. A lower, larger die is face-bonded to the lower surface of the lead frame at a die-bonding region via a second, adhesively coated, insulative, film layer. The wire-bonding pads on both the upper die and lower die are interconnected with the ends of their associated lead extensions with gold or aluminum bond wires. The lower die must be slightly larger than the upper die in order for the die pads to be accessible from above through a bonding window in the lead frame such that wire connections can be made to the lead extensions. This arrangement has a major disadvantage from a production standpoint, due to the requirement for different-sized dice, a somewhat complex lead frame configuration and a somewhat difficult-to-execute wire bonding protocol.

U.S. Pat. No. 5,291,061, issued Mar. 1, 1994 to Ball, teaches a multiple stacked die device containing up to four stacked dice supported on a die-attach paddle of a lead frame, the assembly purportedly not exceeding the height of then-current single die packages, and wherein the bond pads of each die are wire bonded to lead fingers. The relatively low profile of the device is achieved by close-tolerance stacking which is made possible by a low-loop-profile wire bonding operation and disposition of adhesive layers between the stacked dice. However, Ball requires relatively long bond wires to electrically connect the stacked dice to the lead frame. These long bond wires increase resistance and may facilitate shorting due to bond wire sweep during encapsulation. Also, Ball requires the use of spacers between the dice.

U.S. Pat. No. 5,323,060, issued Jun. 21, 1994 to Fogal et al., teaches a multichip module that contains stacked die devices, the terminals or bond pads of which are wire bonded to a substrate or to adjacent die devices. However, as discussed with Ball, Fogal requires long bond wires to electrically connect the stacked die bond pads to the substrate. Fogal also requires the use of spacers between the dice.

U.S. Pat. Nos. 5,422,435 and 5,495,398 to Takiar et al. ("Takiar") teach stacked dice having bond wires extending to each other and to the leads of a carrier member such as a lead frame. However, Takiar also has the problem of long bond wires, as well as requiring specific sized or custom designed dice to achieve a properly stacked combination.

U.S. Pat. No. 5,973,403, issued Oct. 26, 1999 to Wark, teaches stacked dice on a PCB. A first die is flip-chip mounted on the PCB, a second die is back side bonded on the first die, and bond wires extend from the second die to the PCB. However, Wark also has the problem of long bond wires and the excessive and somewhat complex processing steps of both underfilling the first flip-chip mounted die and encapsulating the second die connected with bond wires.

U.S. Pat. No. 6,051,878, issued Apr. 18, 2000 to Akram et al. ("Akram"), teaches multiple stacked substrates having dice mounted thereto using both wire bonding and flip-chip techniques, where some dice are mounted on opposing substrate surfaces.

Therefore, it would be advantageous to develop a fairly straightforward technique and resulting semiconductor device assembly for increasing integrated circuit density of vertically stacked semiconductor dice by reducing the number of process steps for fabricating the assembly in combination while reducing assembly height and employing commercially available, widely practiced semiconductor device fabrication techniques.

BRIEF SUMMARY OF THE INVENTION

The present invention relates to a method and apparatus for increasing integrated circuit density by reducing package height and reducing the number of process steps for fabricating a semiconductor die assembly. The present invention includes a method and apparatus for reducing the height of a plurality of vertically stacked interposer substrates, each interposer substrate having at least one semiconductor die mounted thereon. The present invention further includes stacking interposer substrates having dice mounted thereto, each die being electrically connected to conductive traces of its associated interposer substrate by wire bonding.

The present invention includes at least two oppositely facing interposer substrates, each having secured thereto by its active surface at least one semiconductor die with a portion of its active surface and bond pads thereof exposed through an opening in the interposer substrate and wire bonds extending from the bond pads and looped through the opening to conductive terminals of a first set adjacent the opening and on the opposite side of the interposer substrate from the at least one semiconductor die. The opposing interposer substrates are mutually electrically connected on their terminal sides by a plurality of conductive elements which extends transversely therebetween and electrically connects terminals of a second set on each interposer substrate and laterally offset from the first terminal set, conductive traces extending between associated terminals of the two sets on the same interposer substrate. A third terminal set on a die side of one of the interposer substrates carries a like second plurality of conductive elements extending transversely from that interposer substrate for electrically connecting the stacked interposer substrates to a carrier substrate. An assembly including a carrier substrate is also encompassed by the invention.

According to one embodiment of the present invention, an exposed portion of the active surface of at least one semiconductor die attached to an interposer substrate substantially directly faces and is substantially laterally aligned with an exposed portion of the active surface of at least another semiconductor die attached to another, superimposed interposer substrate, the height of the gap between the two interposer substrates being at least twice the height of the wire bond loops. In another embodiment of the present invention, an exposed portion of the active surface of at least one semiconductor die attached to an interposer substrate substantially directly faces but is at least partially laterally offset from an exposed portion of the active surface of at least another, opposingly oriented semiconductor die attached to another interposer substrate, the height of the gap between the interposer substrates in this instance being at least one wire bond loop height but less than two. In still another embodiment of the present invention, an exposed portion of the active surface of at least one semiconductor die attached to an interposer substrate substantially directly faces an exposed portion of the active surface of another semiconductor die attached to another interposer substrate but is completely laterally offset therefrom, the height of the gap between the interposer substrates being at least the wire bond loop height. Thus, wire bond height may be minimized, depending upon the opening alignment technique selected. In all of the embodiments, a flowable dielectric material may be disposed within the gap to substantially encapsulate both the wire bonds electrically connecting the opposing die and substrates and the discrete conductive elements connecting the terminals of the second sets on the two interposer substrates. Further, a flowable dielectric material may be introduced between the lowermost interposer substrate of an assembly and a carrier substrate to substantially encapsulate the second plurality of conductive elements.

BRIEF DESCRIPTION OF THE SEVERAL VIEWS OF THE DRAWINGS

The method and apparatus of the present invention will be more fully understood from the detailed description of the invention when taken in conjunction with the drawings, wherein.

DETAILED DESCRIPTION OF THE INVENTION

Figure 1A:
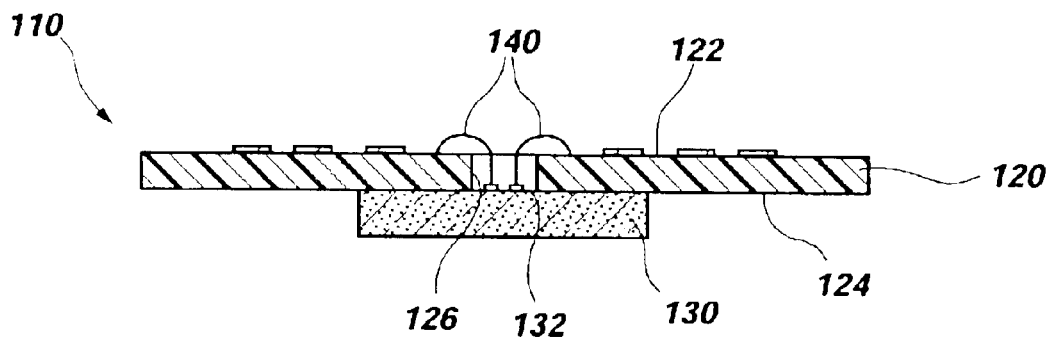
FIGS. 1(a)–1(d) are simplified cross-sectional views of a first embodiment, illustrating a method of vertically stacking, electrically connecting and filling the gaps between electrically connected interposer substrates, each having a semiconductor die attached thereto, in accordance with the present invention.

Embodiments of the present invention will be hereinafter described with reference to the accompanying drawings. It should be understood that the illustrations are not meant to be actual views of any particular apparatus and/or method, but are merely idealized representations which are employed to more clearly and fully depict the present invention than would otherwise be possible. Additionally, elements and features common between the figures retain the same reference numeral designation.

A method and apparatus of a first embodiment of the present invention is shown in FIGS. 1(a)–1(d). FIG. 1(a)

illustrates a simplified cross-sectional view of a first interposer substrate 120 having a first semiconductor device or die ("first die") 130 attached thereto by its active surface 132 to provide a first assembly 110. The first interposer substrate 120 is a substrate that may comprise a flexible material, such as a polymer tape or resin, or a rigid material, such as silicon, ceramic, glass, semiconductor material or a glass fiber laminate such as an FR-4 laminate. The first interposer substrate 120 includes a first surface 122 and a second, opposing surface 124 having an opening 126 in the form of a slot therethrough.

A dielectric adhesive or a double-sided adhesive tape may be provided to a portion of the second surface 124 surrounding a periphery of the opening 126 of the first interposer 120, or, alternatively, the adhesive may be provided to substantially cover the second surface 124 of the first interposer substrate 120. First die 130 is directly attached to the adhesive on the second surface 124 of the first interposer substrate 120, so that an active surface 132 of the first die 130 is face up and accessible from the first surface 122 of the first interposer substrate 120 through the opening 126 therein.

Electrical interconnection between bond pads of the first die 130 and terminals of the first interposer substrate 120 on first surface 122 may be effected by wire bonding. Wire bonds 140 are formed to extend between bond pads on the active surface 132 of the first die 130 through opening 126 and corresponding terminals on the first surface 122 of the first interposer substrate 120.

Figure 1B:
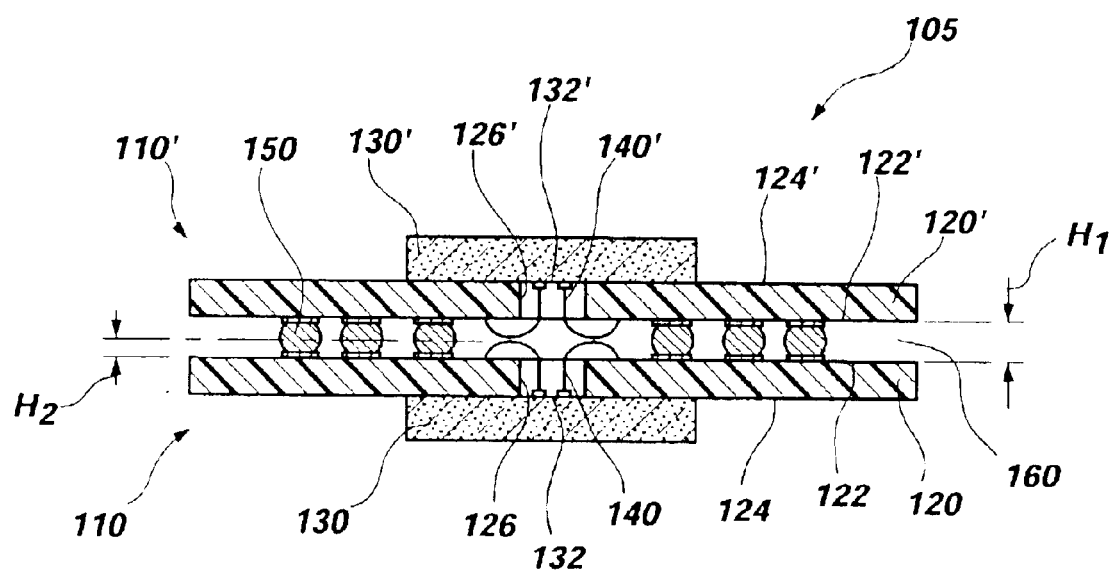

FIG. 1(b) depicts a simplified cross-sectional view of a stacked in-process interposer assembly 105 including the first assembly 110 mounted to a second assembly 110'. The second assembly 110' in the first embodiment of the present invention is preferably structured substantially the same as the first assembly 110. Similar to the first assembly 110, the second assembly includes a second interposer substrate 120' having a first surface 122' and second opposing surface 124' and a second semiconductor device or die ("second die") 130' having an active surface 132' which is attached to the second surface 124' of the second interposer substrate 120'. The second assembly 110' also includes wire bonds 140' electrically connecting terminals of the second interposer substrate 120' and bond pads of second die 130'.

Mounting the first and second assemblies 110 and 110' together is accomplished by flipping the second assembly 110' so that the first surface 122' of the second interposer substrate 120' directly opposes or faces the first surface 122 of the first interposer substrate 120, the active surfaces 132 and 132' thus also facing each other. In this manner, the second assembly 110' may be mounted and bonded to the first assembly 110 by a plurality of discrete conductive elements 150 formed of a lead/tin solder or conductive or conductor-filled epoxy. If solder is employed, reflowing discrete conductive elements 150 at a suitable temperature determined by the material thereof will connect terminals of a second set on first surfaces 122 and 122'. If conductive or conductor-filled epoxy is employed, the discrete conductive elements 150 may be heat-cured. The conductive elements 150 may be structured as balls, bumps, pillars or columns, depending upon the material or materials employed to form same. Other materials for the conductive elements 150 may also include, but are not limited to, copper, silver or gold, as well as alloys thereof. The conductive elements 150 may include a conductive or nonconductive core having one or more conductive layers thereon. Alternatively, a so-called "Z-axis" anisotropically conductive adhesive or adhesive layer may be employed in lieu of discrete conductive elements.

The stacked interposer assembly 105 with a plurality of discrete conductive elements 150 between the first surfaces 122 and 122' of the first and second assemblies 120 and 120' provides a gap 160 therebetween having a height $H_1$ which is defined by the height of the discrete conductive elements 150. As previously set forth, the wire bonds 140 and 140' extend from bond pads of first and second dice 130 and 130' respectively to the first surfaces 122 and 122' of the first and second interposer substrates 120 and 120', the wire bonds 140 and 140' exhibiting a wire bond loop height $H_2$. The wire bond loop height $H_2$ is the distance, for example, that the wire bonds 140 or 140' extend above the first surface 122 or 122' of their associated interposer substrate 120 or 120', as shown in FIG. 1(b). According to the first embodiment of the present invention, the gap height $H_1$ must be greater than the wire bond loop height $H_2$. However, it is preferred that the gap height $H_1$ be at least twice the wire bond loop height $H_2$ to prevent opposing, substantially superimposed wire bonds 140 and 140' from making contact and causing electrical shorts. As a precautionary measure against such shorting, the wire bonds 140 and 140' may have previously applied thereto a low viscosity-type dielectric resin film before stacked interposer assembly 105 is assembled. This film will mutually insulate the wire bonds 140 and 140' and substantially eliminate electrical shorts that may otherwise have the potential to occur between the opposing wire bonds 140 and 140' of the first and second assemblies 110 and 110', particularly if gap 160 is of marginal height with respect to the height of the wire bond loops.

Figure 1C:
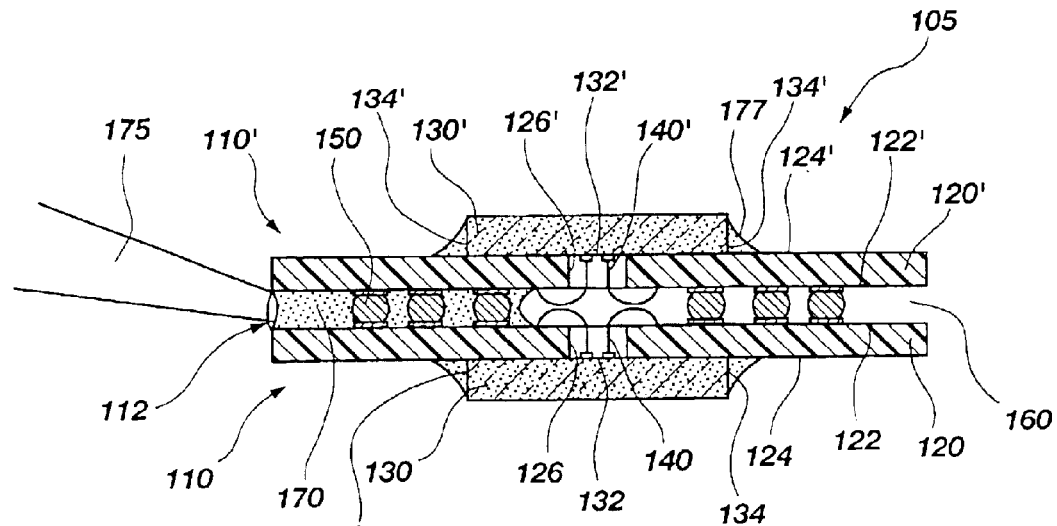

As shown in FIG. 1(c), once the first assembly 110 and the second assembly 110' are electrically connected together as previously described, a dielectric filler material 170 may be disposed into gap 160 between the first assembly 110 and second assembly 110'. The dielectric filler material 170, commonly referred to as an "underfill" compound due to widespread use in flip-chip assemblies, serves to distribute loads placed on the first and second assemblies 110 and 110' due to thermal expansion and contraction during operation. If dielectric filler material 170 is thermally conductive, it may also facilitate transfer of heat generated from the first and second dice 130 and 130'. The dielectric filler material 170 also reduces the potential for environmental contamination between the first and second assemblies 110 and 110' and provides an additional mechanical bond between the first and second assemblies 110 and 110'. The filler material 170 may comprise a flowable polymeric material, such as an epoxy or an acrylic resin, and may contain inert filler material therein to reduce cost.

To promote filling the gap 160 efficiently and effectively, it is necessary to fill the gap 160 in a minimal amount of time without voids or air pockets forming in the filler material 170. Such efficiency may be optimized by a person of ordinary skill in the art manipulating the viscosity and surface tension of the filler material to accommodate the height of the gap 160. Another consideration to promote filling efficiency is in the method used to fill the gap 160. Such methods for filling the gap 160 may include, but are not limited to, injecting, alone or in combination with pressurized and vacuum-assist methods. For example, filling the gap 160 may be accomplished by applying the filler material 170 from a dispenser nozzle 175, which may comprise a needle. The dispenser nozzle 175 may fill the gap 160 by dispensing dielectric filler material 170 at either one side edge 112 or two adjacent side edges (such as side edge 112 in combination with an edge facing the reader) of the stacked interposer assembly 105. The dielectric filler material 170 may then be allowed to freely flow and fill the gap 160 as a result of capillary forces between the first and second assemblies 110 and 110'. The stacked interposer assembly 105 may be tilted downward away from dispenser nozzle 175 to employ a gravity assist to flow. Further, in utilizing the one-sided or two-sided dispense method, the dielectric filler material 170, when of an appropriate viscosity, pushes and removes the air from the gap 160 as the filler material 170 fills the space therein. The dispenser nozzle 175 may be affixed to the reservoir of a syringe or any other dispensing apparatus known in the art. After application of the dielectric filler material 170, it may be cured by heat, ultraviolet light, other radiation, or other suitable means (depending on the dielectric filler material selected) to at least a semisolid mass.

Additionally, as shown in FIG. 1(c), a dielectric encapsulation material 177 may be provided to edges 134 and 134' of the respective active surfaces 132 and 132' of the first and second dice 130 and 130'. The dielectric encapsulation material 177 provides an additional sealant between each die and its associated interposer substrate from the environment. Further, it provides an additional mechanical bond between each die and its associated interposer substrate to help distribute loading and thermal stress.

Figure 1D:
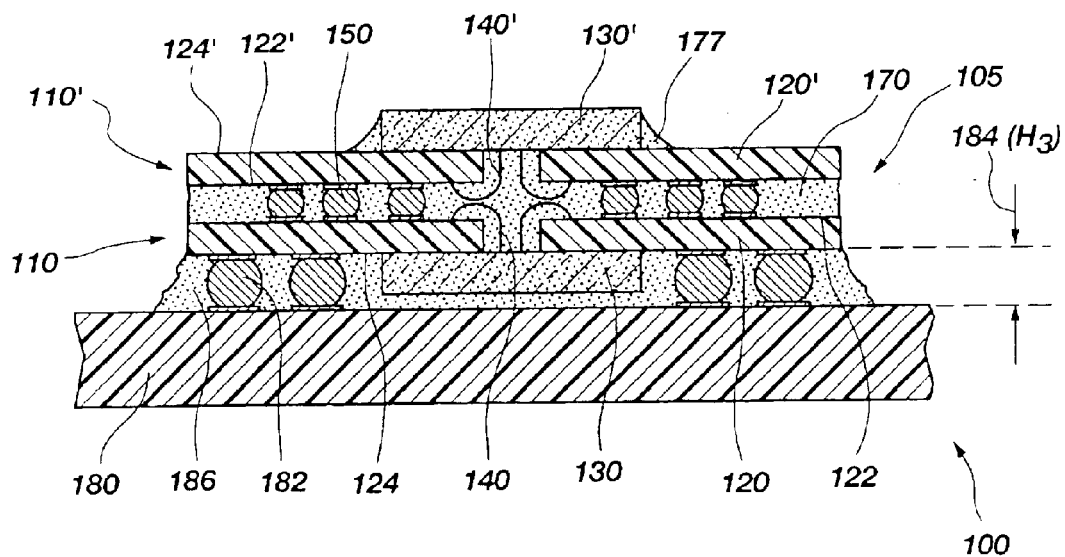

As shown in FIG. 1(d), a stacked multidie assembly 100 comprises the stacked interposer assembly 105 attached to a carrier substrate 180 such as a PCB with a plurality of discrete conductive elements 182 therebetween. The discrete conductive elements 182 may contact terminals of a third set on either of the second surfaces 124 and 124' of the first and second assemblies 110 and 110' for mechanically and electrically connecting stacked interposer assembly 105 to conductive traces of the carrier substrate 180. Discrete conductive elements 182 may comprise any of the materials or combinations thereof previously mentioned with respect to discrete conductive elements 150 and may be of any suitable configuration.

Further, as shown in FIG. 1(d), once the stacked interposer assembly 105 is bonded to the carrier substrate 180 via the conductive elements 182, as previously set forth, next, a dielectric underfill material 186 may optionally be applied to fill a gap 184 therebetween. As previously discussed with respect to filling the gap 160 between the first assembly 110 and second assembly 110', the gap 184 may be similarly filled, employing any method known to one of ordinary skill in the art. Further, gap 184 must be at least a height $H_3$ equal to or greater than the thickness of the first die 130 or second die 130' (depending upon which die is disposed between the lowermost interposer substrate and carrier substrate 180).

Therefore, it is apparent that the above-described stacked multi-die assembly 100, having gap 160 at a minimum height $H_1$ due to the absence of a die between the adjacent interposer substrates 120 and 120', results in a substantial decrease in the height of the assembly. Further, it should be appreciated that the present invention provides encapsulation of both the wire bonds 140 and 140' for the first and second assemblies 110 and 110' and, additionally, encapsulation of the discrete conductive elements 150 between the first and second assemblies 110 and 110', all of which are provided in one process step of filling the gap 160 with the dielectric filler material 170. In sum, the present invention provides a method and apparatus that provides increased circuit density while also reducing the number of fabrication steps.

Figure 2:
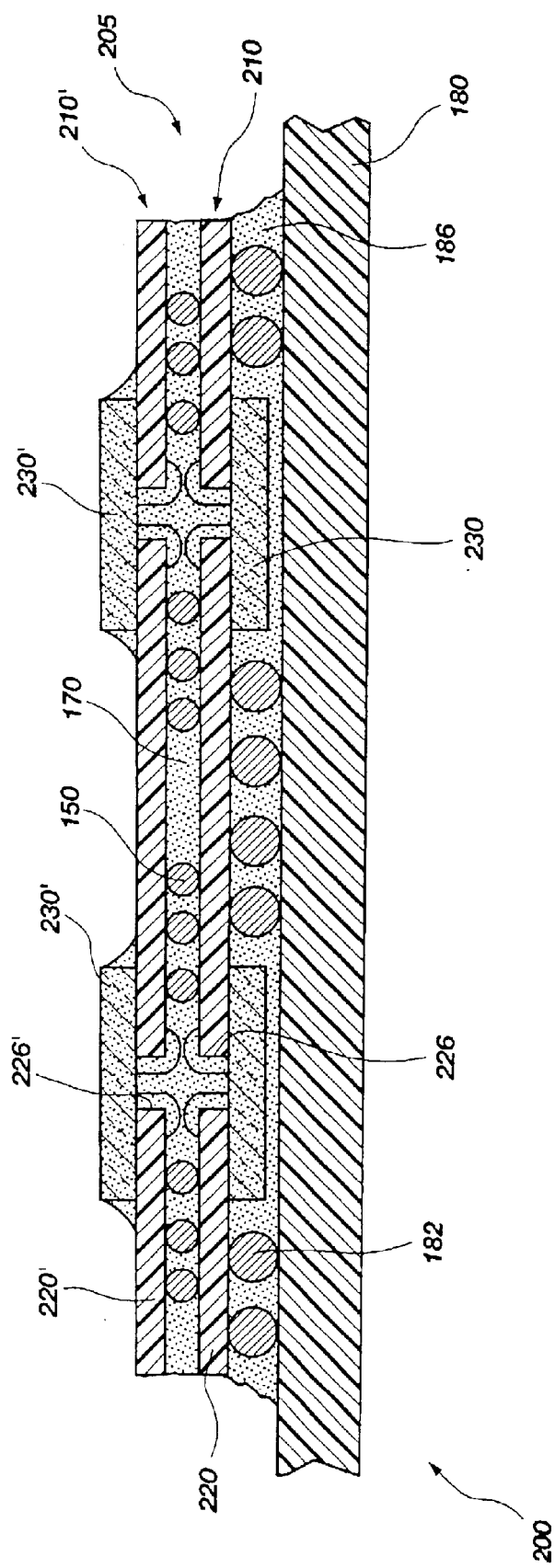
FIG. 2 is a simplified cross-sectional view of a variation of the first embodiment, illustrating vertically stacked interposer substrates having multiple dice attached to each interposer substrate, in accordance with the present invention.

A variation 200 of the first embodiment of the present invention is illustrated in FIG. 2, depicting a simplified cross-sectional view of stacked interposer assembly 205 having multiple first and second dice 230 and 230' respectively attached to each of first and second interposer substrates 220 and 220'. This variation is similar to the stacked multi-die assembly 100 in every respect except the first and second assemblies 210 and 210' include, but are not limited to, multiple first and second dice 230 and 230' directly attached over associated openings 226 and 226' in the first and second interposer substrates 220 and 220'.

Figure 3:
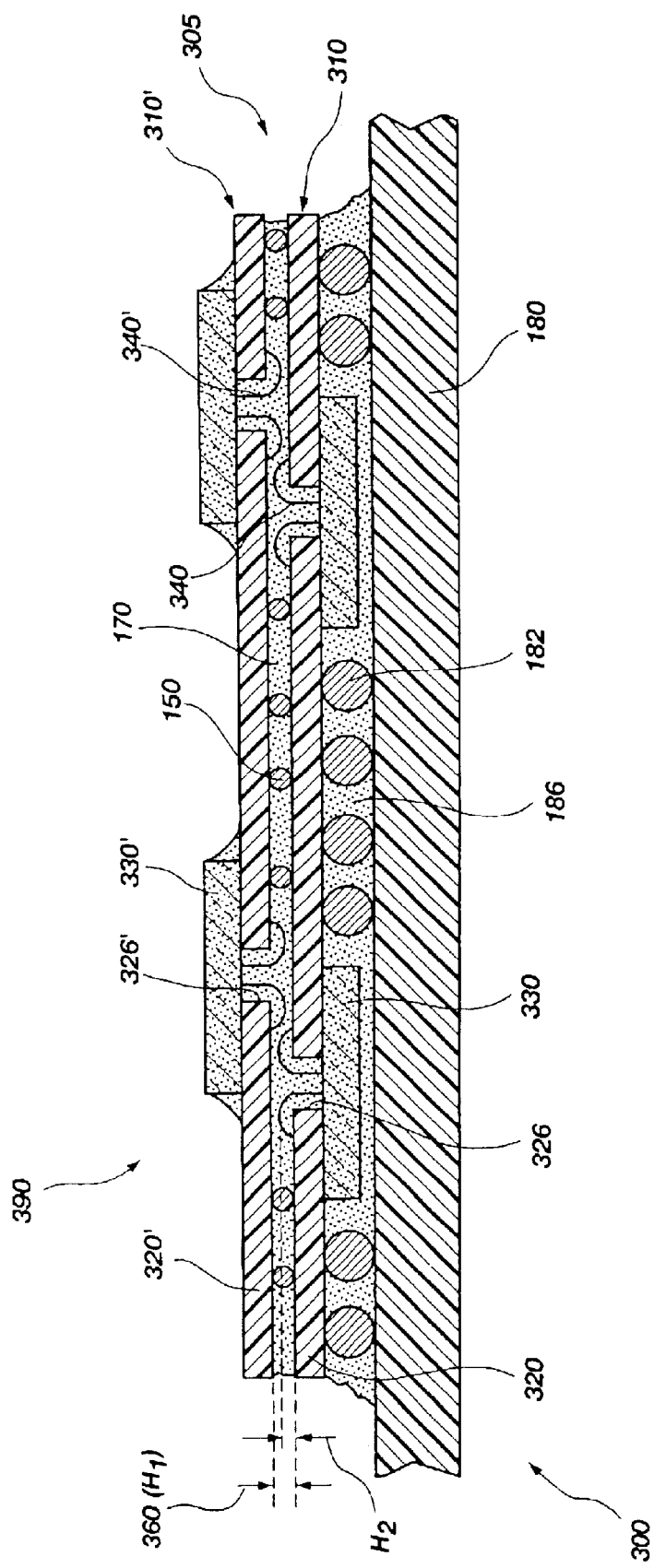
FIG. 3 is a simplified cross-sectional view of a second embodiment, illustrating vertically stacked interposer substrates having at least partially laterally offset dice attached thereto, in accordance with the present invention.

A second embodiment 300 of the present invention is illustrated in FIG. 3, depicting a partial simplified cross-sectional view of stacked interposer assembly 305 having multiple first and second dice 330 and 330' respectively attached to each of first and second interposer substrates 320 and 320'. The second embodiment is similar to the first embodiment except the openings 326 and 326' in the first and second assemblies 310 and 310' include a staggered, or laterally offset, opening arrangement 390 so that the openings 326 and 326' in the opposing first and second interposer substrates 320 and 320' are not directly aligned and facing each other in mutual superimposition. As a result, the wire bonds 340, for example, in the first assembly 310 do not directly face and cannot contact the wire bonds 340' in the second assembly 310'. Significantly, the staggered or laterally offset opening configuration 390 reduces the necessary height $H_1$ of the gap 360 to be the same or only slightly larger than the wire bond loop height $H_2$ since opposing but laterally offset wire bonds 340 and 340' cannot contact each other. As shown in FIG. 3, the first and second interposer substrates 320 and 320' may each include multiple openings 326 and 326' in the staggered opening configuration 390 for attaching multiple first and second dice 330 and 330' to the first and second interposer substrates 320 and 320'. Alternatively, the first and second interposer substrates 320 and 320' may each include only one opening in the staggered opening configuration 390. It is notable that the second embodiment of the present invention includes the same advantages as that discussed in the first embodiment and, additionally, the second embodiment includes a minimized required gap height between the interposer substrates to promote a reduced package height for a high circuit density.

Figure 4:
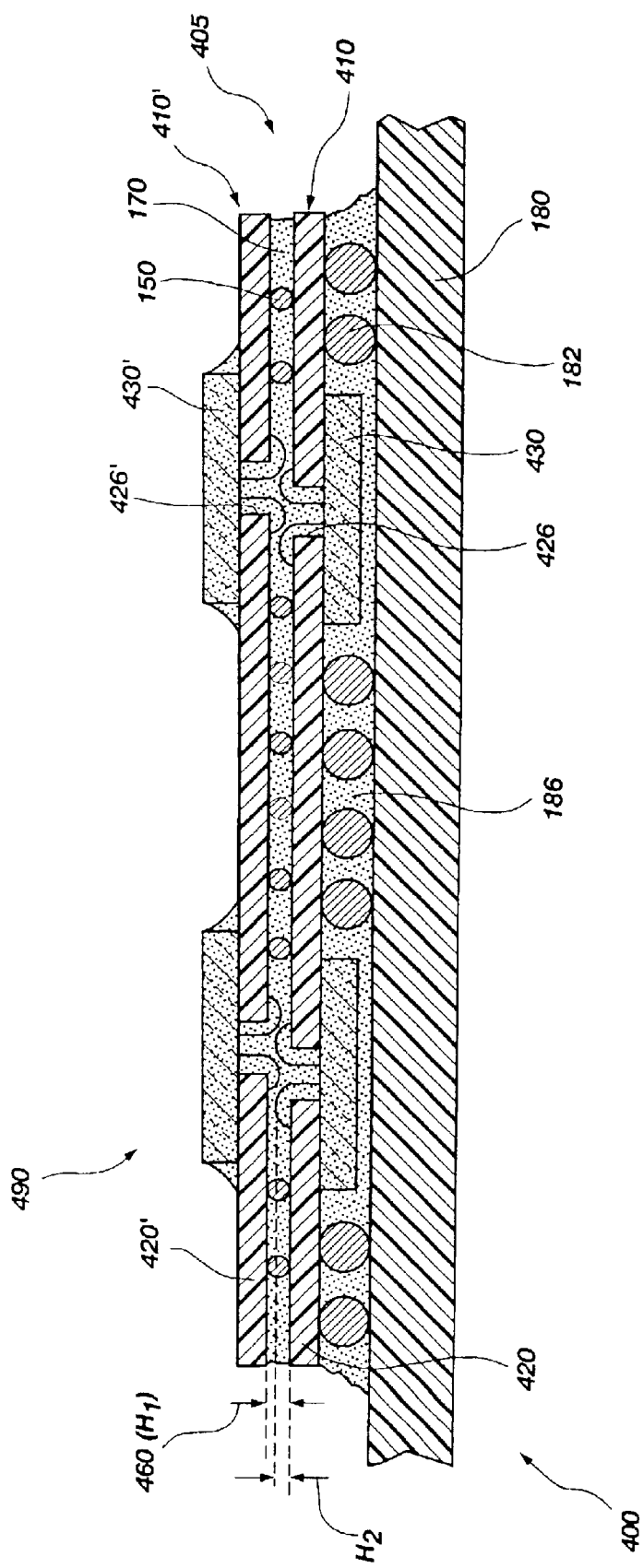
FIG. 4 is a simplified cross-sectional view of a variation of the second embodiment, illustrating vertically stacked interposer substrates having substantially superimposed dice attached thereto, in accordance with the present invention.

A variation 400 of the second embodiment is illustrated in FIG. 4, which depicts a partial simplified cross-sectional view of stacked interposer assembly 405 having multiple first and second dice 430 and 430' respectively attached to first and second interposer substrates 420 and 420'. This variation is similar to the second embodiment except that the staggered opening configuration 490 includes opposing openings 426 and 426' in first and second assemblies 410 and 410' partially aligned to directly face each other. In particular, the opposing openings 426 and 426' are preferably staggered so that, for example, one opening is directly aligned and facing at least a portion of an opposing opening. With this particular staggered opening configuration 490, the height $H_1$ of the gap 460 may be between the wire bond loop height $H_2$ and twice the wire bond loop height $H_2$ ($H_2<H_1<2H_2$). As in the previous embodiments and alternatives thereof, it is well appreciated that this structure offers the same advantages of increased integrated circuit density with a reduced package height as well as reducing the number of process steps.

The present invention also contemplates that an entire die secured to an interposer substrate may be over-molded for complete encapsulation of the sides and back side thereof, or may not be encapsulated whatsoever. Further, use of a dielectric underfill material between adjacent interposer substrates may be omitted if desired, although use thereof is currently preferred. Additional openings may be formed in the interposer substrates to facilitate introduction of the dielectric underfill material or avoidance of bubbles or voids. Further, one or more additional dice or other electrical components may be secured to the interposer assembly on the top side thereof (as to be mounted to a carrier substrate and electrically connected to the interposer assembly as known in the art).

While the present invention has been disclosed in terms of certain illustrated embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. An electronic device package, comprising:
   a first substrate having a first surface and a second opposing surface;
   a second substrate having a first surface and a second opposing surface, the first surface of the second substrate adjacent to the first surface of the first substrate;
   at least one semiconductor die attached to the second opposing surface of the first substrate;
   at least another semiconductor die attached to the second opposing surface of the second substrate;
   at least one bond wire extending from a bond pad on the at least one semiconductor die attached to the second opposing surface of the first substrate to a terminal on the first surface of the first substrate;
   at least another bond wire extending from a bond pad on the at least another semiconductor die attached to the second opposing surface of the second substrate to a terminal on the first surface of the second substrate; and
   at least one conductive element extending from a terminal on the first surface of the first substrate to a terminal on the first surface of the second substrate and electrically connecting the first substrate and the second substrate.

2. An electronic device package, comprising:
   a first substrate having a first surface and a second opposing surface;
   a second substrate having a first surface and a second opposing surface, the first surface of the second substrate adjacent to the first surface of the first substrate;
   at least one semiconductor die attached to the second opposing surface of the first substrate;
   at least another semiconductor die attached to the second opposing surface of the second substrate;
   at least one bond wire extending from the at least one semiconductor die attached to the second opposing surface of the first substrate to the first surface of the first substrate;
   at least another bond wire extending from the at least another semiconductor die attached to the second opposing surface of the second substrate to the first surface of the second substrate;
   at least one conductive element extending between the first surface of the first substrate and the first surface of the second substrate and electrically connecting the first substrate and the second substrate; and
   a dielectric material disposed between the first substrate and the second substrate and encapsulating at least a portion of the at least one bond wire, the at least another bond wire, and the at least one conductive element.

3. The electronic device package of claim 2, wherein the dielectric material comprises a polymeric material.

4. The electronic device package of claim 1, wherein at least one of the first substrate and the second substrate comprises a substantially flexible material.

5. The electronic device package of claim 4, wherein the substantially flexible material comprises a polymer tape or resin.

6. The electronic device package of claim 1, wherein at least one of the first substrate and the second substrate comprises a substantially rigid material.

7. The electronic device package of claim 6, wherein the substantially rigid material comprises one of silicon, ceramic, glass, semiconductor material, and a glass-fiber laminate.

8. The electronic device package of claim 1, wherein at least one of the at least one bond wire and the at least another bond wire is coated with a dielectric resin film.

9. The electronic device package of claim 1, further comprising a dielectric material deposited on at least one of the second opposing surface of the first substrate and the second opposing surface of the second substrate to at least partially encapsulate at least one edge of the at least one semiconductor die and the at least another semiconductor die.

10. The electronic device package of claim 1, further comprising:
    a first plurality of semiconductor dice attached to the second opposing surface of the first substrate, each semiconductor die of the first plurality of semiconductor dice having a bond wire extending from a bond pad thereon to a terminal on the first surface of the first substrate; and
    a second plurality of semiconductor dice attached to the second opposing surface of the second substrate, each semiconductor die of the second plurality of semiconductor dice having a bond wire extending from a bond pad thereon to a terminal on the first surface of the second substrate.

11. The electronic device package of claim 1, wherein the at least one conductive element extending from a terminal on the first surface of the first substrate to a terminal on the first surface of the second substrate comprises one of a metal, a metal alloy, and an anisotropically conductive adhesive.

12. The electronic device package of claim 1, wherein the at least one conductive element extending from a terminal on the first surface of the first substrate to a terminal on the first surface of the second substrate comprises a discrete ball, bump, or column.

13. The electronic device package of claim 1, further comprising at least one conductive element attached to a terminal on the second opposing surface of the first substrate configured to connect the electronic device package to a carrier substrate.

14. The electronic device package of claim 13, wherein the at least one conductive element attached to a terminal on the second opposing surface of the first substrate comprises one of a metal, a metal alloy, and an anisotropically conductive adhesive.

15. An electronic device package, comprising:
    a first substrate having a first surface and a second opposing surface;
    a second substrate having a first surface and a second opposing surface, the first surface of the second substrate adjacent to the first surface of the first substrate;
    at least one semiconductor die attached to the second opposing surface of the first substrate;

at least another semiconductor die attached to the second opposing surface of the second substrate;

at least one bond wire extending from the at least one semiconductor die attached to the second opposing surface of the first substrate to the first surface of the first substrate;

at least another bond wire extending from the at least another semiconductor die attached to the second opposing surface of the second substrate to the first surface of the second substrate;

at least one conductive element extending between the first surface of the first substrate and the first surface of the second substrate and electrically connecting the first substrate and the second substrate;

at least one conductive element attached to the second opposing surface of the first substrate configured to connect the electronic device package to a carrier substrate wherein the at least one conductive element attached to the second opposing surface of the first substrate is attached to the carrier substrate; and a dielectric material disposed between the first substrate and the carrier substrate and encapsulating at least a portion of the at least one conductive element attached to the second opposing surface of the first substrate.

16. The electronic device package of claim 13, wherein the at least one conductive element attached to a terminal on the second opposing surface of the first substrate comprises a discrete ball, bump, or column.

17. The electronic device package of claim 1, wherein the at least one bond wire and the at least another bond wire are substantially aligned on an axis extending perpendicular to the first surface of the first substrate and the first surface of the second substrate.

18. The electronic device package of claim 17, wherein:

the at least one bond wire has a loop height between the first surface of the first substrate and the first surface of the second substrate;

the at least another bond wire has a loop height between the first surface of the first substrate and the first surface of the second substrate; and a transverse distance between the first surface of the first substrate and the first surface of the second substrate is greater than the sum of the loop height of the at least one bond wire and the loop height of the at least another bond wire.

19. The electronic device package of claim 1, wherein the at least one bond wire and the at least another bond wire are at least partially laterally offset from one another on an axis extending perpendicular to the first surface of the first substrate and the first surface of the second substrate.

20. The electronic device package of claim 19, wherein:

the at least one bond wire has a loop height between the first surface of the first substrate and the first surface of the second substrate;

the at least another bond wire has a loop height between the first surface of the first substrate and the first surface of the second substrate; and a transverse distance between the first surface of the first substrate and the first surface of the second substrate is greater than either of the loop heights of the at least one bond wire and the at least another bond wire and is less than the sum of the loop height of the at least one bond wire and the loop height of the at least another bond wire.

* * * * *